United States Patent [19]

Pearson et al.

[11] Patent Number: 4,780,956
[45] Date of Patent: Nov. 1, 1988

[54] FLOATING CROWN FOR INSERTION-EXTRACTION HEAD

[75] Inventors: Rune S. Pearson, Torrance; Paul T. Duval, Lomita, both of Calif.

[73] Assignee: Reliability Incorporated, Houston, Tex.

[21] Appl. No.: 46,842

[22] Filed: May 5, 1987

[51] Int. Cl.⁴ .............................................. H05K 3/30
[52] U.S. Cl. ...................................... 29/740; 29/743; 29/759; 294/2; 294/64.1
[58] Field of Search ................ 29/740, 741, 743, 759, 29/766, 762; 294/64.1, 2

[56] References Cited

U.S. PATENT DOCUMENTS 4,515,507 5/1985 Asai et al. .......................... 29/740 X Primary Examiner—Carl E. Hall
Attorney, Agent, or Firm—Gregory L. Maag; David S. Wise

[57] ABSTRACT

A head assembly for a burn-in board loader and unloader comprises a mounting block having a generally vertical track. A main body is mounted on the mounting block and afforded vertical movement along the track. The main body has a vertical bore through which a vertically movable plunger extends. The main body also comprises at least three vertical mounting wire holes spaced-apart around the bore. A floating crown having a vertical bore through which the plunger extends is mounted on the upper end of the main body by mounting wires which are fixedly attached at their upper ends to the crown and extend downwardly into the mounting wire holes. The mounting wires are fixedly attached at their lower ends to the main body at the lower ends of the mounting wire holes. The crown is preferably mounted to provide a gap between the crown and main body of about 0.005 inch.

21 Claims, 4 Drawing Sheets

FLOATING CROWN FOR INSERTION-EXTRACTION HEAD

FIELD OF THE INVENTION

This invention relates to burn-in board loaders and unloaders and more particularly to a burn-in board loader-unloader in which the insertion-extraction heads have floating crowns.

BACKGROUND OF THE INVENTION

Integrated circuit packages are presently in wide use in the electronics industry in various types of electronic equipment. It has been found that a bad integrated circuit package will normally fail within about one year of the time of its initial use. The failure of an integrated circuit package in actual use can be vary expensive.

To eliminate such failures of integrated circuit packages in use, it has become a common practice to test the integrated circuits by simulating operation for up to a year or more. This testing process is known as a "burn-in" process.

The burn-in process is accomplished by means of a burn-in board. Burn-in boards are printed circuit boards on which a number of sockets which receive an integrated circuit package are soldered. A typical burn-in board is 8 inches wide and 24 inches long and has about 200 individual sockets. Each socket has a plurality of electrical contacts which engage the leads of the integrated circuit package. Each socket contact in turn is electrically connected by the printed circuit to an edge connector on one end of the burn-in board.

Individual integrated circuits are placed in the sockets with each pin of the integrated circuit package making electrical contact through the socket to the edge connector. Once the burn-in board is loaded, it is placed into an oven where the devices are electrically exercised while at an elevated temperature for a period from about 24 to about 96 hours. At the completion of the burn-in process, the boards are unloaded and reloaded with the next batch of integrated circuit packages and the burn-in process is repeated.

Integrated circuit packages are becoming progressively smaller with the leads being placed closer together. The new generations of integrated circuit packages are referred to as surface mounted devices (SMD). SMDs include small outline (SO) integrated circuits, plastic leadless chip carrier (PLCC) and leadless chip carrier, usually ceramic (LCC). The lead spacing of SMDs is typically 0.050 inch center-to-center and may eventually become as small as 0.025 inch center-to-center spacing.

Recently, specialized sockets for receiving SMDs and automatic loaders and unloaders for burn-in boards with the new SMD sockets have been developed. One such socket, a zero insertion force (ZIF) socket, has a lid which is depressed to spread the contacts to facilitate insertion and removal.

The automatic loaders and unloaders typically comprise a series of insertion-extraction heads, each head having a crown and a movable plunger extending through the crown. The SMDs are singulated onto the crown and held in place on the end of the plunger, e.g. by vacuum. Each head is then moved toward a socket until the crown engages the socket and depresses the socket lid. The plunger then moves forwardly, placing the SMD into the socket. While the plunger holds the SMD in the socket, the crown is moved away from the socket releasing the socket lid and securing the SMD in the socket. The plunger is then backed away into its original position ready to insert a new SMD into a new socket. The burn-in board is then advanced and the process repeated.

Removal of SMDs from the sockets generally involves the same series of steps but in reverse order. That is, the extraction head is brought into a position with the crown engaging the socket, but not depressing the lid. The plunger is then moved forwardly to engage the SMD within the socket. The crown is then moved forwardly to depress the lid of the socket and the plunger then backed away to remove the SMD from the socket. The crown is then backed away from the socket and the SMD released directly into a packaging tube.

The close lead spacing of the SMDs requires exact placement of devices into the burn-in sockets. Typical device insertion requirements are ±0.002 inch in each of the X, Y, and Z directions referenced to the particular socket being loaded. These insertion requirements tend to be more precise than the socket positions on the burn-in board due to inaccuracies in the placement of sockets on the burn-in boards as well as board warpage caused by the temperature changes during the burn-in process. Accordingly, the crown and plunger of the insertion-extraction heads must be automatically alignable to the exact location and orientation of the socket on the burn-in board, i.e., the crown and plunger must be automatically adjusted in the X and Y directions. In addition, because most SMD sockets have a lid which must be fully depressed to open its electrical contacts for insertion and removal of the SMD devices, the crown and plunger must be automatically adjustable in the Z direction.

Insertion-extraction heads are known wherein the crown is mounted on the main body of the head by a combination of coil and leaf springs. The coil springs are positioned between the main body and the crown. The leaf springs are fixedly attached at their lower ends to the side walls of the head main body and extend upwardly across the side wall of the crown. At their upper ends, the leaf springs have a hole or slot through which a pin, which protrudes laterally outwardly from the side walls of the crown, extends. The slot is larger than the pin and affords the leaf springs and hence the crown movement relative to the main body. The leaf springs generate a "return-to-center" force on the crown.

The above design has several drawbacks. Because the crown is only loosely secured to the head, it is difficult to maintain control of the crown position and orientation. As a result the crown has a tendency to become tilted, i.e. not parallel, relative to the burn-in board and socket. During insertion, such tilting prevents accurate placement of the SMD in the socket and may result in damage to the SMD, socket or even the head. Moreover, the presence of the leaf springs and laterally extending pins means that the heads cannot be mounted in the loader-unloader in close proximity to each other. As a result of the required head spacing, adjacent sockets of a row cannot be loaded or unloaded at the same time. Two passes of the burn-in board are required to load a row of sockets.

SUMMARY OF THE INVENTION

The present invention provides a head assembly for a burn-in board loader and/or unloader. The head assembly comprises a main body having a generally vertical primary bore through which a movable plunger extends. A floating crown is mounted adjacent the upper end of the main body. The crown has an upper surface adapted to receive an integrated circuit package, particularly a surface mounted device (SMD). The crown has a generally vertical bore coaxial with the primary bore of the main body through which the upper end of the plunger extends.

The plunger is movable between a lower position wherein the upper end of the plunger is at or below the upper surface of the crown and an upper position wherein the upper end of the plunger is spaced-apart above the upper surface of the crown. Means are provided for moving the plunger between its upper position and its lower position. Means are also provided for releasably securing an integrated circuit package to the upper end of the plunger.

The head assembly further comprises means for securing the crown to the main body whereby the crown is afford a limited amount of lateral and rotational movement relative to the main body and whereby angular or tilting movement of the crown relative to the main body is substantially prevented. Preferred securing means comprises at least three, and preferably four, generally vertical mounting wires fixedly attached at their lower ends to the main body and fixedly attached at their upper ends to the crown.

In a particular preferred embodiment of the invention, the main body comprises a generally vertical mounting wire hole associating with each wire. Each mounting wire hole extends from the upper surface of the main body downwardly to a position above the lower surface of the main body and has a diameter greater than the diameter of the mounting wires. Each mounting wire extends downwardly from the crown into a separate mounting wire hole and is fixedly attached and its lower end to the main body at the lower end of the mounting wire hole.

Preferably, the head assembly further comprises a mounting block on which the main body is movably mounted. The main body is afforded vertical movement relative to the mounting block between an upper position and a lower position. Means are provided for releasably applying upward and downward forces on the main body for moving the main body upwardly and downwardly relative to the mounting block.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION

Figure 1:
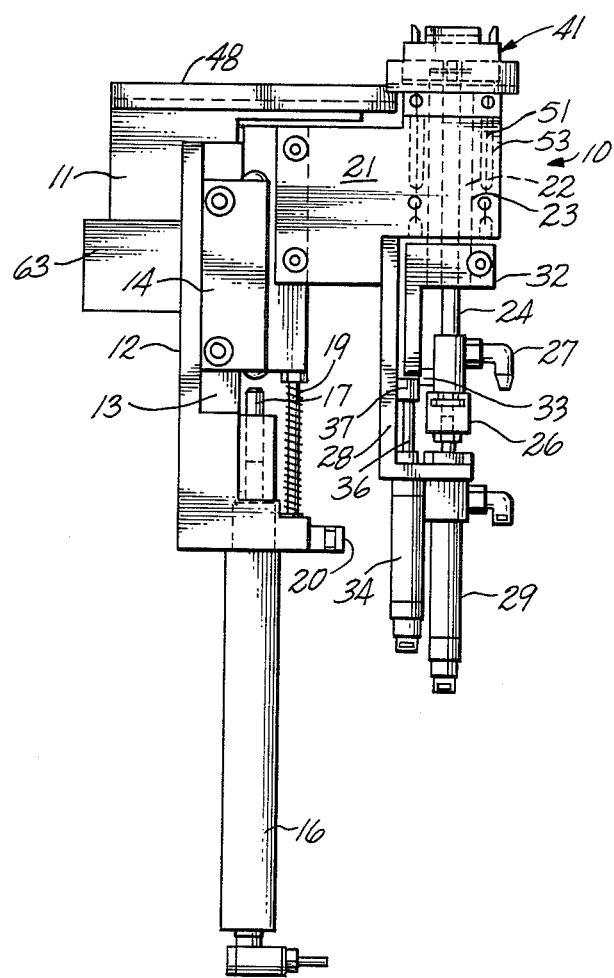
FIG. 1 is a side view of a preferred burn-in board loader-unloader head assembly.

The present invention is particularly suitable for use in an insertion-extraction head assembly such as that shown in FIGS. 1-4. In the figures, the head assembly 10 is shown in a generally vertical orientation. Accordingly, the description herein is with reference to a vertical orientation. It is understood, however, that the head assembly may be used in any suitable orientation.

The head assembly 10 comprises a mounting block 11 which is fixedly attached to a main body mount 12. The main body mount 12 has a generally vertical track 13 on which a vertical bearing assembly 14 is mounted. The vertical bearing assembly 14 is afforded vertical movement along the length of the track 13.

A pressure transducer cylinder 16 is mounted on the main body mount 12 at a position below the vertical bearing assembly 14 with the piston rod 17 of the pressure transducer cylinder 16 extending upwardly to and engaging the lower end of the vertical bearing assembly 14. Activation of the pressure transducer cylinder 16 results in a force being applied to the vertical bearing assembly 14 for moving the vertical bearing assembly 14 upwardly.

Figure 2:
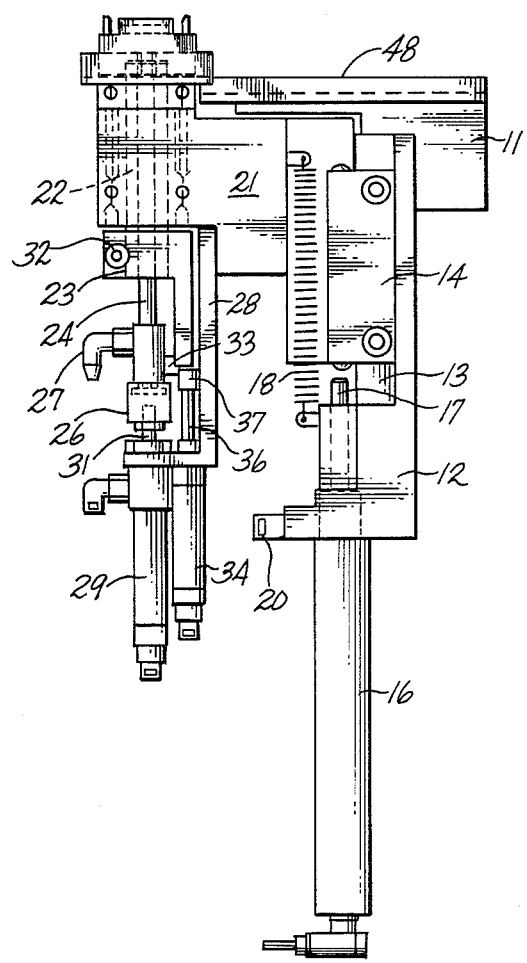
FIG. 2 is an opposite side view of the head assembly shown in FIG. 1.

As shown in FIG. 2, a spring 18 is attached at its upper end to the vertical bearing assembly 14 and attached at its lower end to the main body mount 12. The spring 18 expands as the vertical bearing assembly 14 moves upwardly along the track 13 creating a downward force on the vertical bearing assembly 14. When the pressure transducer cylinder 16 is deactivated, the downward force generated by the spring 18 causes the vertical bearing assembly 14 to move downwardly. A vertically movable bar 19 extends downwardly for triggering a break beam sensor 20 when the vertical bearing assembly 14 reaches a select lowest position. When triggered, the break beam sensor 20 causes the entire head assembly 10 to be lowered.

Figure 4:
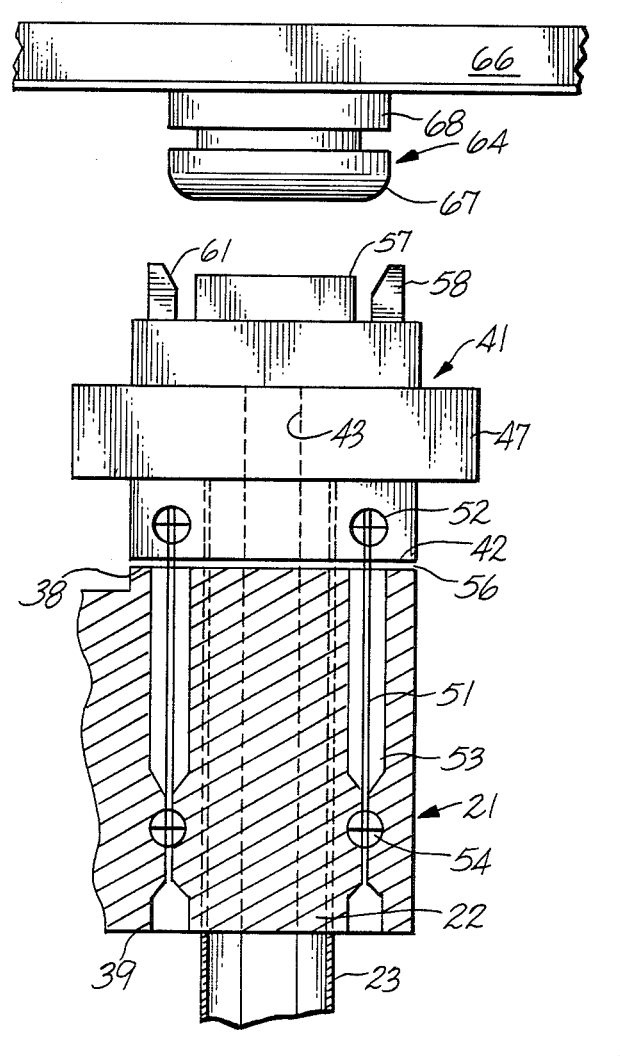
FIG. 4 is a fragmentary cross-sectional view of the main body and crown of the head assembly of FIGS. 1-3 shown in relation to a burn-in board.

Fixedly attached to the vertical bearing assembly 14 and movable with the vertical bearing assembly 14 is a main body 21. The main body 21 has generally flat, horizontally extending upper and lower surfaces 38 and 39 respectively (FIG. 4). The main body 21 further comprises a primary, generally cylindrical, vertical bore 22 which extends the entire vertical length of the main body 21 from the upper surface 38 to the lower surface 39. A plunger sleeve 23 lines the wall of the vertical bore 22 and extends downwardly below the lower surface 39 of the main body.

A generally cylindrical hollow plunger 24 extends vertically within the primary bore 22 of the main body 21 and extends above the upper surface 38 and below the lower surface 39 of the main body 21. The outer diameter of the plunger 24 is less than the inner diameter of the sleeve 23.

At the lower end of the plunger 24 there is a plunger coupling 26 which comprises a hollow connector 27 in communication with the hollow interior of the plunger 24. The hollow connector 27 is coupled to a vacuum line (not shown) for reducing the air pressure within the plunger 24. Vacuum, i.e. reduced air pressure is used to secure an SMD at the upper end of the plunger 24 during insertion and removal of the SMD from a socket.

A cylinder bracket 28 is fixedly mounted on the main body 21 and extends downwardly to a position below the lower end of the plunger 24 and plunger coupling 26. A double acting air cylinder 29 is mounted on the cylinder bracket 28 with a piston rod 31 of the air cylinder 29 extending upwardly to the plunger coupling 26 and secured thereto. Activation of the air cylinder 29 to extend the piston rod 31 results in upward movement of the plunger 24. Activation of the air cylinder 29 to retract the piston rod 31 results in downward movement of the plunger 24.

The plunger and SMD must be aligned with a socket during insertion and removal of the SMD from the socket. Accordingly, it is important that the plunger 24 not be allowed to rotate. Rotation of the plunger 24 is prevented by a non-rotation bracket 32. The non-rotation bracket 32 has an upper end which extends around and is fixedly clamped to the lower portion of the plunger sleeve 23 which extends below the main body 21. At its lower end, the non-rotation bracket 32 has a generally vertical slot (not shown). A dowel pin 33 is fixedly attached to the plunger coupling 26 and extends into the slot and is afforded slidable vertical movement within the slot. The slot and dowel pin 33 arrangement prevents rotation of the plunger coupling 26 and hence the plunger 24 relative to the main body 21.

A second air cylinder 34 is mounted on the cylinder bracket 28 and has a piston rod 36 which extends upwardly to a select vertical location. At its upper end, the piston rod comprises a stop 37 which engages the dowel pin 33 to limit downward movement of the dowel pin 33, plunger coupling 26 and plunger 24 to the select vertical location. This enables the head assembly to be used with a wide variety of integrated circuit packages. For example, with such an arrangement, the stop 37 can be adjusted so that at its lowest position, the upper end of the plunger 24 extends upwardly into the channel 44. This enables the plunger 24 to grip an integrated circuit package that sits off the channel floor due to downwardly extending leads.

A crown 41 having a generally flat lower surface 42 (FIG. 4) is mounted adjacent the upper surface 38 of the main body 21. The crown 41 comprises a generally vertical bore 43 which is generally coaxial with the primary bore 22 of the main body 21. The upper portion of the plunger 24 is disposed within the bore 43. The diameter of the bore 43 is about the same as or slightly greater than the diameter of the plunger 24 to thereby afford the plunger 24 vertical movement relative to the crown 21, but to substantially prevent lateral movement of the plunger 24 relative to the crown 41.

Figure 3:
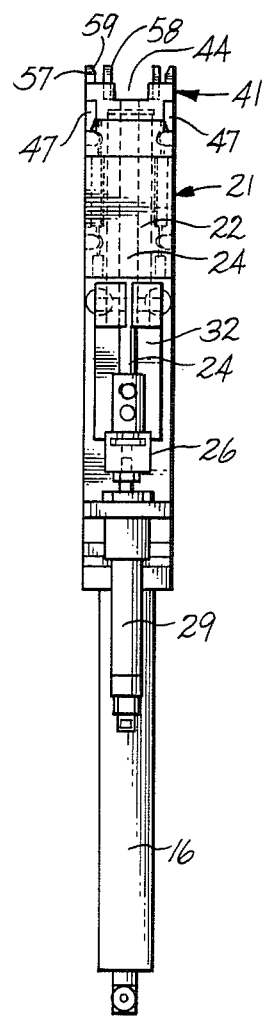
FIG. 3 is an end view of the head assembly shown in FIGS. 1 and 2.

At the top of the crown 41 there is provided a channel 44 for receiving SMDs which are singulated onto the crown 41 (FIG. 3). The channel 44 has a width about the same as or slightly greater than the width of the SMDs and is formed by a generally horizontal surface and a pair of generally parallel vertical surfaces on either side of the horizontal surface. The bore 43 is located centrally within the channel 44.

In the embodiment shown, a crown 41 has a pair of horizontally extending guides 47 at each end of the crown 41. The guides 47 align the crown 41 with an input chute (not shown) through which the SMDs are singulated onto the crown 41 and an output chute 48 which extends across the top of the mounting block 11.

With reference to FIG. 4, the crown 41 is secured to the main body 21 by four mounting wires 51 which are attached at their upper ends to the crown 41 and attached at their lower ends to the main body 21. More specifically, the upper ends of the mounting wires 51 extend into holes in the lower surface 42 of the crown 41 and which have a diameter about the same as the diameter of the mounting wires 51. The mounting wires 51 are secured within the holes by set screws 52.

From the crown 41, the mounting wires 51 extend downwardly into mounting wire holes 53 in the main body 21. The mounting wire holes 53 have a diameter greater than the diameter of the mounting wires 51. In the embodiment shown, the holes 53 extend about three quarters of the vertical length of the main body 21. At the lower ends of the holes 53, the mounting wires 51 are fixedly secured to the main body 21 by set screws 54. The thickness or diameter of the mounting wires 51 is not critical but must be at least sufficient to support the crown without bowing within the mounting wire holes 53. A wire made of stainless steel and having a diameter of about 0.032 inch or has been found to be suitable.

The vertical length and the diameter of the mounting wire holes 53 are also not critical. Preferably, however, the length and diameter of the mounting wire holes 53 are sufficient to afford the crown 41 movement relative to the main body of at least about 0.050 inch in any lateral direction, i.e. 0.050 inch in any X and Y direction. A diameter of about 0.130 inch is presently preferred for the diameter of the mounting wire holes 53. A height of about one inch for the mounting wire holes 53 is also presently preferred.

The crown 41 is preferably mounted on the main body 21 with a slight gap 56 between the upper surface 38 of the main body 21 and the lower surface 42 of the crown 41. A gap 56 of about 0.005 inch is presently preferred.

The size of the gap 56 between the main body 21 and a crown is not critical. In fact, while such a gap is desired to reduce friction between the crown 41 and the main body 21, an arrangement where the lower surface 42 of the crown 41 slidably engages the upper surface 38 of the main body 21 may be used if desired.

If a gap is provided, it is preferred that the size of the gap 56 is sufficiently small to prevent the formation of permanent bends in the mounting wires 51. If there is a large gap, such permanent bends may result at the corner of the holes 53 and upper surface 38 of the main body 21 due to excessive lateral movement of the crown 41. Such permanent bends may also form with large gaps if the crown engages a mechanical obstruction which forces the corwn back against the main body. In the latter situation, it is preferred that the size of the gap be selected so that the mounting wires 51 would slightly bow within the mounting wire holes 53 rather than form permanent bends.

The upper surface of the crown 41 is provided with means for aligning the crown 41 with the burn-in socket. In the embodiment shown, the crown 41 comprises a pair of generally vertically extending alignment plates 57 spaced-apart on either side of the channel 44 and in parallel relation to each other. Two pairs of alignment pins 58 are also provided which, together with the alignment plates 57, define a generally square or rectangular geometry corresponding to the perimeter of the socket. The upper inner surfaces 59 of the alignment plates 57 and the upper inner surfaces 61 of the alignment pins 58 are beveled.

In the practice of the invention, a row of head assemblies 10 are mounted in a burn-in board loader-unloader on a rail 63 (FIG. 1) or the like which lifts and lowers the head assemblies 10 into and out of contact with a row of sockets 64 on a burn-in board 66, shown in FIG. 4. In loading the burn-in board 66, SMDs are first singulated into the channel 44 of the crown 41 and held in place on the upper end of the plunger 24 by vacuum. The rail 63 is then moved upwardly to a select position wherein the beveled surfaces 59 and 61 of the alignment plates 57 and pins 58 engage the outer edges of the socket lid 67 and depress the lid 67 against the socket base 68. Because the crown 41 is afforded lateral and rotational movement relative to the main body 21, the crown automatically aligns with the socket 64 as the beveled surfaces 59 and 61 engage the outer edges of the socket lid 67.

During this procedure, the pressure transducer cylinder 16 is activated to generate a select upward force on the main body 21 and crown 41. The force is selected to be about the minimum required to depress the lid 67 of the socket 64. This force compensates for socket variations along the Z axis. For example, if the position of the crown 41 and alignment plates 57 and pins 58 as the result of the upward movement by the rail 63 is insufficient to completely depress the lid 67 of the socket 64, the main body 21 and crown 41 will continue to move upwardly to completely depress the lid 67 due to the force applied by the pressure transducer cylinder 16.

In the event that there is an obstruction between the crown 41 and the socket 64, or if the socket 64 is mounted on the burn-in board 66 so that the lid 67 is fully depressed before the rail 63, and hence the entire head assembly 10, reaches its apex, forward movement of the crown 41 and main body 21 will stop if the force caused by the obstruction is greater than the force applied by the pressure transducer cylinder 16. Thus, the pressure transducer cylinder 16 provides automatic adjustment of the main body and crown 41 relative to the socket in the vertical direction or laong the Z axis and prevents damage to an integrated circuit package being inserted in the socket. If the obstruction is so large that bar 19 triggers the break beam sensor 20, the entire head assembly retracts.

After the socket lid 67 has been depressed, the SMD is inserted into the socket 64 by means of the plunger 24. Air cylinder 29 is activated to extend the plunger 24, the insertion force being limited by the amount of air pressure used to activate air cylinder 29. The rail 63 then moves downwardly, backing the crown 41 away from the socket 64, releasing the lid 67. As the crown 41 backs away, plunger 24 extends further to maintain the SMD in the socket 64. Once the lid 67 has been released, the vacuum is shut off to release the SMD from the plunger 24 and the cylinder 29 is activated to retract the plunger 24 to its original position.

In removing the SMD from a socket 64, the rail 63 moves the head assembly 10 upwardly so that the crown 41 contacts the socket 64, depressing the lid 67. During this, the plunger 24 is extended to contact the SMD in the socket 64. After the lid 67 has been depressed, the lunger 24 is retracted, removing the SMD from the socket 64. The head assembly 10 is then backed away from the socket 64. The pressure transducer cylinder 16 is then deactivated, allowing the spring 18 to lower the main body 21 and crown 41 so that the crown 41 is aligned with the output chute 48. The vacuum in the plunger is then shut off, releasing the SMD down the output chut 48 and into a packaging tube.

The present invention offers several unique advantages. For example, by use of the mounting wires, and the spacing between the crown and the main body, the crown is afforded lateral and rotational movement while substantially preventing angular or tilting movement of the crown. This means that the lateral position and orientation of the crown is automatically adjusted while maintaining the SMD in parallel relation to the socket.

Another advantage of the present invention is that the head assemblies can be mounted in the loader/unloader with the crowns in very close proximity to each other. This enables the loading and unloading of a complete row of sockets at one time as compared to some conventional loaders and unloaders which may only load every other socket in a row at one time and those loaders and unloaders with spring mounted crowns.

The preceding description has been presented with reference to the presently preferred embodiment of the invention shown in the accompanying drawings. Workers skilled in the art and technology to which this invention pertains will appreciate that alterations and changes in the described apparatus and structure can be practiced without meaningfully departing from the principles, spirit and scope of this invention.

For example, while the preceding description was made with reference to a head assembly capable of both insertion and extraction of a SMD from a burn-in board, it is apparent that the head assembly may be designed for only insertion or only extraction as desired. Thus the invention is applicable to burn-in board loaders or unloaders as well as loader/unloaders.

It is apparent that the number of mounting wires may vary. Four mounting wires spaced apart symmetrically around the primary bore is presently preferred. However, three mounting wires spaced apart and in surrounding relation to the primary bore may be suitable. Likewise, five or more mounting wires may be used as desired.

It is also apparent that practice of the present invention is not restricted to the loading and unloading of SMDs, but is equally applicable to any integrated circuit package. In face, the present invention may be useful in any automatic loader or unloader that inserts and/or extracts an item from any closely aligned compartment.

Accordingly, the foregoing description should not be read as pertaining only to the precise structures described, but rather should be read consistent with and as support for the following claims which are to have their fullest fair scope.

What is claimed is:

1. A head assembly comprising:
   a main body having a generally vertical primary bore;
   a floating crown positioned at the upper end of the main body having an upper surface including means for receiving an item, said crown having a generally vertical bore coaxial with the primary bore of the main body;
   means for securing the crown to the main body whereby the crown is afforded lateral and rotational movement relative to the main body but wherein angular movement relative to the main body is substantially prevented, said securing means comprising a plurality of generally vertical mounting wires fixedly attached at their lower ends to the main body and fixedly attached at their upper ends to the crown.

2. A head assembly as claimed in claim 1 wherein the securing means comprises at least three generally vertical mounting wires fixedly attached at their lower ends to the main body and fixedly attached at their upper ends to the crown.

3. A head assembly as claimed in claim 2 wherein the securing means comprises four generally vertical mounting wires fixedly attached at the lower ends to the main body and fixedly attached at their upper ends to the crown.

4. A head assembly as claimed in claim 2 wherein the main body comprises a generally vertical mounting wire hole assoiciated with each wire, each mounting wire hole extending from the upper surface of the main body downwardly to a position above the lower surface of the main body and wherein each mounting wire extends downwardly through such mounting wire hole, the lower end of the mounting wire being fixedly attached to the main body at the lower end of the mounting wire hole.

5. A head assembly as claimed in claim 1 further comprising:
  a mounting block wherein the main body is mounted on the mounting block and afforded vertical movement relative to the mounting block between a lower position and an upper position; and
  means for applying upwardly and downwardly directed forces against the main body for moving the main body between its lower and upper positions.

6. A head assembly comprising:
  a main body having a generally vertical primary bore;
  a floating crown positioned at the upper end of the main body having an upper surface including means for receiving an integrated circuit package, said crown having a generally vertical bore coaxial with the primary bore of the main body;
  means for securing the crown to the main body whereby the crown is afforded lateral and rotational movement relative to the main body but wherein angular movement relative to the main body is substantially prevented, said securing means comprising a plurality of generally vertical mounting wires fixedly attached at their lower ends to the main body and fixedly attached at their upper ends to the crown;
  a vertically extending plunger disposed within the vertical bores of the main body and crown, said plunger being movable between a lower position wherein the upper end of the plunger is at or below the upper surface of the crown and an upper position spaced apart above the upper surface of the crown;
  means for moving the plunger between its upper and lower positions; and
  means for releasably securing an integrated circuit package to the upper end of the plunger.

7. A head assembly as claimed in claim 6 wherein the securing means comprises at least three generally vertical mounting wires fixedly attached at their lower ends to the main body and fixedly attached at their upper ends to the crown.

8. A head assembly as claimed in claim 6 wherein the securing means comprises four generally vertical mounting wires fixedly attached at the lower ends to the main body and fixedly attached at their upper ends to the crown.

9. A head assembly as claimed in claim 7 wherein the main body comprises a generally vertical mounting wire hole associated with each wire, each mounting wire hole extending from the upper surface of the main body downwardly to a position above the lower surface of the main body and wherein each mounting wire extends downwardly through such mounting wire hole, the lower end of the mounting wire being fixedly attached to the main body at the lower end of the mounting wire hole.

10. A head assembly as claimed in claim 6 further comprising:
  a mounting block wherein the main body is mounted on the mounting block and afforded vertical movement relative to the mounting block between a lower position and an upper position; and
  means for applying upwardly and downwardly directed forces against the main body for moving the main body between its lower and upper positions.

11. A head assembly comprising:
  a main body having generally flat upper and lower surfaces and a generally vertical primary bore which extends the vertical length of the main body and at least three generally vertical mounting wire holes spaced-apart in surrounding relation to the primary bore, said mounting wire holes extending from the upper surface downwardly to a position above the lower surface;
  a floating crown positioned at the upper end of the main body having a generally flat lower surface and an upper surface including means for receiving an integrated circuit package, said crown having a generally vertical bore coaxial with the primary bore of the main body;
  a generally vertical mounting wire associated with each mounting wire hole, said mounting wire being fixedly attached at its upper end to the crown and extending downwardly through a mounting wire hole and fixedly attached at its lower end to the main body at the lower end of the mounting wire hole;
  a vertically extending plunger disposed within the primary vertical bore of the main body and vertical bore of the crown, said plunger being movable between a lower position wherein the upper end of the plunger is at or below the upper surface of the crown and an upper position spaced apart above the upper surface of the crown;
  means for moving the plunger between its upper and lower positions; and
  means for releasably securing an integrated circuit package to the upper end of the plunger.

12. A head assembly as claimed in claim 11 wherein the main body comprises four mounting wire holes.

13. A head assembly as claimed in claim 11 wherein the crown is spaced-apart from the main body to provide a gap between the lower surface of the crown and the upper surface of the main body.

14. A head assembly as claimed in claim 13 wherein the gap is about 0.005 inch in vertical height.

15. A head assembly as claimed in claim 11 further comprising:
  a mounting block wherein the main body is mounted on the mounting block and afforded vertical movement relative to the mounting block between a lower position and an upper position; and
  means for applying upwardly and downwardly directed forces against the main body for moving the main body between its lower and upper positions.

16. A head assembly comprising:
  a mounting block having a generally vertical track;
  a main body mounted on the mounting block, and afforded vertical movement along the track between a lower position and an upper position, said main body comprising a generally flat upper surface, a lower surface and a generally vertical primary bore extending from the upper surface to the lower surface;
  a floating crown positioned at the upper end of the main body having a generally flat lower surface and an upper surface including means for receiving an integrated circuit package, said crown having a generally vertical bore coaxial with the bore of the main body;

means for securing the crown to the main body whereby the crown is afforded a limited amount of lateral and rotational movement relative to the main body but wherein angular movement relative to the main body is substantially prevented, said securing means comprising a plurality of generally vertical mounting wires fixedly attached at their lower ends to the main body and fixedly attached at their upper ends to the crown;

a vertically extending plunger disposed within the vertical bores of the main body and crown, said plunger being movable between a lower position wherein the upper end of the plunger is at or below the upper surface of the crown and an upper position spaced apart above the upper surface of the crown;

means for moving the plunger between its upper and lower positions;

means for releasably securing an integrated circuit package to the upper end of the plunger;

means for applying an upwardly directed force against the main body for moving the main body upwardly along the track; and means for applying a downwardly directed force against the main body for moving the main body downwardly along the track.

17. A head assembly as claimed in claim 16 wherein the securing means comprises at least three generally vertical mounting wires fixedly attached at their lower ends to the main body and fixedly attached at their upper ends to the crown.

18. A head assembly as claimed in claim 17 wherein the attaching means comprises four generally vertical mounting wires fixedly attached at the lower ends to the main body and fixedly attached at the upper ends to the crown.

19. A head assembly as claimed in claim 17 wherein the main body comprises a generally vertical mounting wire hole associated with each mounting wire, each mounting wire hole extending from the upper surface of the main body downwardly to a position above the lower surface of the main body and wherein each mounting wire extends through such mounting wire hole, the lower end of the mounting wire being fixedly attached to the main body at the lower end of the mounting wire hole.

20. A head assembly as claimed in claim 16 wherein th crown is spaced-apart from the main body to provide a gap between the lower surface of the crown and the upper surface of the main body.

21. A head assembly as claimed in claim 20 wherein the gap is about 0.005 inch in vertical height.

* * * * *

UNITED STATES PATENT AND TRADEMARK OFFICE
CERTIFICATE OF CORRECTION

PATENT NO. : 4,780,956
DATED : November 1, 1988
INVENTOR(S) : Rune S. Pearson and Paul T. Duval It is certified that error appears in the above—identified patent and that said Letters Patent is hereby corrected as shown below:

Column 7, line 27: change "laong" to --along--

Column 7, line 49: change "lunger" to --plunger--

Column 8, line 31: change "face" to --fact--

Signed and Sealed this

Sixth Day of June, 1989

Attest:

DONALD J. QUIGG

Attesting Officer

Commissioner of Patents and Trademarks